United States Patent
Denda et al.

(10) Patent No.: US 6,747,920 B2
(45) Date of Patent: Jun. 8, 2004

(54) INFORMATION REPRODUCTION APPARATUS AND INFORMATION REPRODUCTION

(75) Inventors: Akihiro Denda, Kawagoe (JP); Yoshiya Nonaka, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 235 days.

(21) Appl. No.: 10/158,017

(22) Filed: May 31, 2002

(65) Prior Publication Data

US 2002/0181339 A1 Dec. 5, 2002

(30) Foreign Application Priority Data

Jun. 1, 2001 (JP) ..................... P2001-166572

(51) Int. Cl.[7] .............................................. G11B 21/08
(52) U.S. Cl. ...................................................... 369/30.9
(58) Field of Search .............................. 369/30.9, 30.8, 369/53.21, 97.23; 386/94, 95, 125, 126; 380/201, 203; 705/57, 58; 360/60

(56) References Cited

U.S. PATENT DOCUMENTS 6,118,744 A * 9/2000 Sturgeon et al. ......... 369/47.23
6,278,836 B1 * 8/2001 Kawara et al. ............... 386/94
6,519,412 B1 * 2/2003 Kim ............................. 386/94
6,694,090 B1 * 2/2004 Lewis et al. .................. 386/94

* cited by examiner

Primary Examiner—Tan Dinh
(74) Attorney, Agent, or Firm—Nixon & Vanderhye P.C.

(57) ABSTRACT

An information reproduction apparatus for reproducing an item of program information from among a plurality of items of program information recorded on a recording medium, the plurality of items of program information including program information to which reproduction restriction information is added, and the information reproduction apparatus includes: a continuous reproduction specifying device for specifying continuous reproduction of a plurality of items of program information recorded on the recording medium; a determination device for determining based on the reproduction restriction information whether an item of program information is prohibited to be reproduced; and a control device for starting the continuous reproduction of the item of program information if the continuous reproduction of the item of program information is specified through the continuous reproduction specifying device, wherein the control device causes an item of program information determined by the determination device as being prohibited to be reproduced to be skipped and the reproduction to be continued after the continuous reproduction is started.

8 Claims, 4 Drawing Sheets

INFORMATION REPRODUCTION APPARATUS AND INFORMATION REPRODUCTION

BACKGROUND OF THE INVENTION

1. Field of the Invention

The present invention relates to an information reproduction apparatus and an information reproduction method that can reproduce program information to which reproduction restriction information is added based on the reproduction restriction information.

2. Description of the Related Art

It is known that, in order to prohibit illegal duplication of program information (contents) such as digital audio and video information to protect the copyright holder of the contents, reproduction restriction information such as an expiration date and the number of times the contents is allowed to be reproduced is added to the contents and recorded on a recording medium (for example, a CD (Compact Disk), MD (Mini-Disk), MO (Magneto-Optical) disk, or card-type recording medium such as MemoryStick (registered Japanese trademark)) that can be used with a given information reproduction apparatus and provided to a user, because of recent advances in digital audio/video information and data compression technology such as MP3 (MPEG Audio Layer 3), ATRAC (Adaptive Transform Acoustic Coding) 3, and WMA.

The contents to which such reproduction restriction information is added can also be distributed to user's information reproduction apparatus such as a personal computer, audio aparatus, small, lightweight mobile devices (a cellular phone or PHS (Personal Handy-Phone System, for example), or PD (Portable Device) via a computer network such as the Internet or a mobile communications network.

Moreover, the user can edit contents with restriction information recorded on the recording medium and record it in a desired reproduction order on another recording medium or record it on another recording medium together with another content to which no restriction information is added to an extent allowed by the reproduction restriction information.

An audio apparatus capable of reproducing such contents on a recording medium displays an error message and stops reproduction when it detects contents that become prohibited to be reproduced because the allowed number of reproduction times specified in reproduction restriction information is exceeded or an allowable reproduction term is expired while continuously reproducing the contents recorded on the recording medium.

However, stopping the reproduction each time a reproduction-prohibited content is encountered is extremely burdensome and inconvenience because a user who wants to continue reproducing contents recorded on the recording medium must manipulate a forward key.

In addition, in order for the user to see whether or not contents are prohibited to be reproduced, the user must select the contents to reproduce them.

SUMMARY OF THE INVENTION

It is therefore an object of the present invention to provide an information reproduction apparatus and information reproduction method that retain continuous reproduction even if reproduction-prohibited program information is encountered during continuous reproduction of the program information to which reproduction restriction information is added and allow a user to readily check whether program information is prohibited to be reproduced.

The above object of the present invention can be achieved by an information reproduction apparatus provided with: a continuous reproduction specifying device for specifying continuous reproduction of a plurality of items of program information recorded on the recording medium; a determination device for determining based on the reproduction restriction information whether an item of program information is prohibited to be reproduced; and a control device for starting the continuous reproduction of the item of program information if the continuous reproduction of the item of program information is specified through the continuous reproduction specifying device, wherein the control device causes an item of program information determined by the determination device as being prohibited to be reproduced to be skipped and the reproduction to be continued after the continuous reproduction is started.

According to the present invention, the apparatus is configured so as to automatically skip reproduction-prohibited program information encountered after starting continuous reproduction of the reproduction-prohibited program information and reproduction-allowed program information co-reside to be recorded on a recording medium, thereby allowing the continuous reproduction of the program information to be retained. Therefore, an easy-to-use information reproduction apparatus can be provided that allows the user to be relived of the burden of operating the apparatus to skip a reproduction-prohibited music track each time such track is encountered.

In one aspect of the information reproduction apparatus of the present invention, the apparatus further provides with a single-item reproduction device for specifying an item of program information among the plurality of items of program information recorded on the recording medium, when reproduction of a certain item of program information is specified by the single-item reproduction device, if the certain item of program information is determined by the determination device as being prohibited to be reproduced, the control device causes the reproduction of the item of program information to be stopped.

According to this aspect, the apparatus allows the user to readily check whether program information is prohibited to be reproduced.

In another aspect of the information reproduction apparatus of the present invention, if the continuous reproduction is specified through the continuous reproduction specifying device and reproduction of a certain item of program information is specified through the single-item reproduction device during the continuous reproduction of the items of program information, the control device causing the determination device to determine whether the specified certain item of program information is prohibited to be reproduced.

In further aspect of the information reproduction apparatus of the present invention, the control device causes the reproduction of the item of program information to be stopped if the specified certain item of program information is determined by the determination device as being prohibited to be reproduced.

In further aspect of the information reproduction apparatus of the present invention, the control device causes the specified certain item of program information to be reproduced and thereafter the continuous reproduction specified through the continuous reproduction specifying device to be continued if the specified certain item of program information is determined by the determination device as not being prohibited to be reproduced.

According to this aspect, the user can readily check whether desired program information is prohibited to be reproduced by specifying the program information during reproduction and, if it is shown that the program information is not reproduction-prohibited, the user can continue the continuous reproduction. Therefore, high convenience can be provided to the user.

In further aspect of the information reproduction apparatus of the present invention, the apparatus further provides with a display device for displaying information, the control device causes the display device to display information indicating that the item of program information determined by the determination device as being prohibited to be reproduced is prohibited to be reproduced.

According to this aspect, the user can visually identify reproduction-prohibited program information.

In further aspect of the information reproduction apparatus of the present invention, the reproduction restriction information includes information for restricting the number of times which the items of program information is allowed to be reproduced or information for restricting the term during which the items of program information is allowed to be reproduced.

The above object of the present invention can be achieved by an information reproduction method provided with: a process of determining whether continuous reproduction of a plurality of program information recorded on the recording medium is specified; a process of determining whether reproduction of one item of program information among the plurality of items of program information recorded on the recording medium is specified; a process of determining based on the reproduction restriction information whether the item of program information is prohibited to be reproduced; a process of causing the continuous reproduction to be started and causing the item of program information determined as being prohibited to be reproduced to be skipped and the continuous reproduction to be continued if the continuous reproduction is specified; and a process of causing reproduction of the item of program information to be stopped if reproduction of the one item of program information is specified and the item of program information is determined as being prohibited to be reproduced.

According to the present invention, the method can be provided that allows the user to be relived of the burden of operating the apparatus to skip a reproduction-prohibited music track each time such a track is encountered. The user can readily identify reproduction-prohibited program information.

DETAILED DESCRIPTION OF THE PREFERRED EMBODIMENTS

Figure 1:
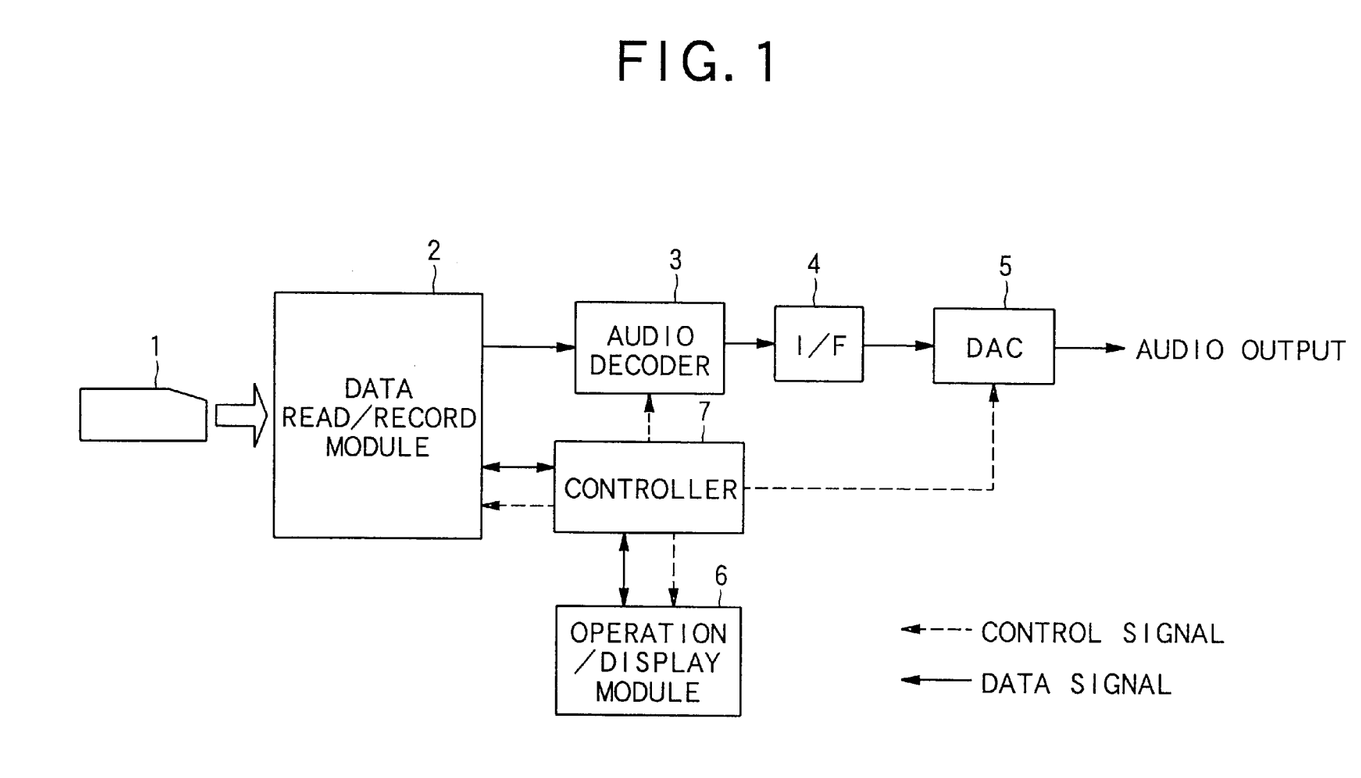
FIG. 1 shows a schematic block diagram of a configuration of a part of an audio apparatus according to an embodiment that relates to the present invention.

A preferred embodiment of the present invention will be described below with respect to the accompanying drawings. In the embodiment described below, an information reproduction apparatus according to the present invention is applied to an audio apparatus. FIG. 1 shows a schematic block diagram of a configuration of a part of the audio apparatus according to the embodiment that relates to the present invention. In FIG. 1, a card-type recording medium 1, data read/record module 2, audio decoder 3, interface (I/F) 4, digital-to-analog converter (DAC) 5, operation/display module 6, and controller 7, which relate to the present invention, make up the audio apparatus together with an amplifier, CD player, MD recorder, and tuner, which are not shown.

The card-type recording medium 1 as a recording medium is detachably attached to the data read/record module 2. A plurality of items of audio data (a plurality of music) are recorded on the card-type recording medium 1 in this embodiment. The card-type recording medium 1 may contain audio data including reproduction restriction information, together with audio data including no reproduction restriction information.

Figure 2:
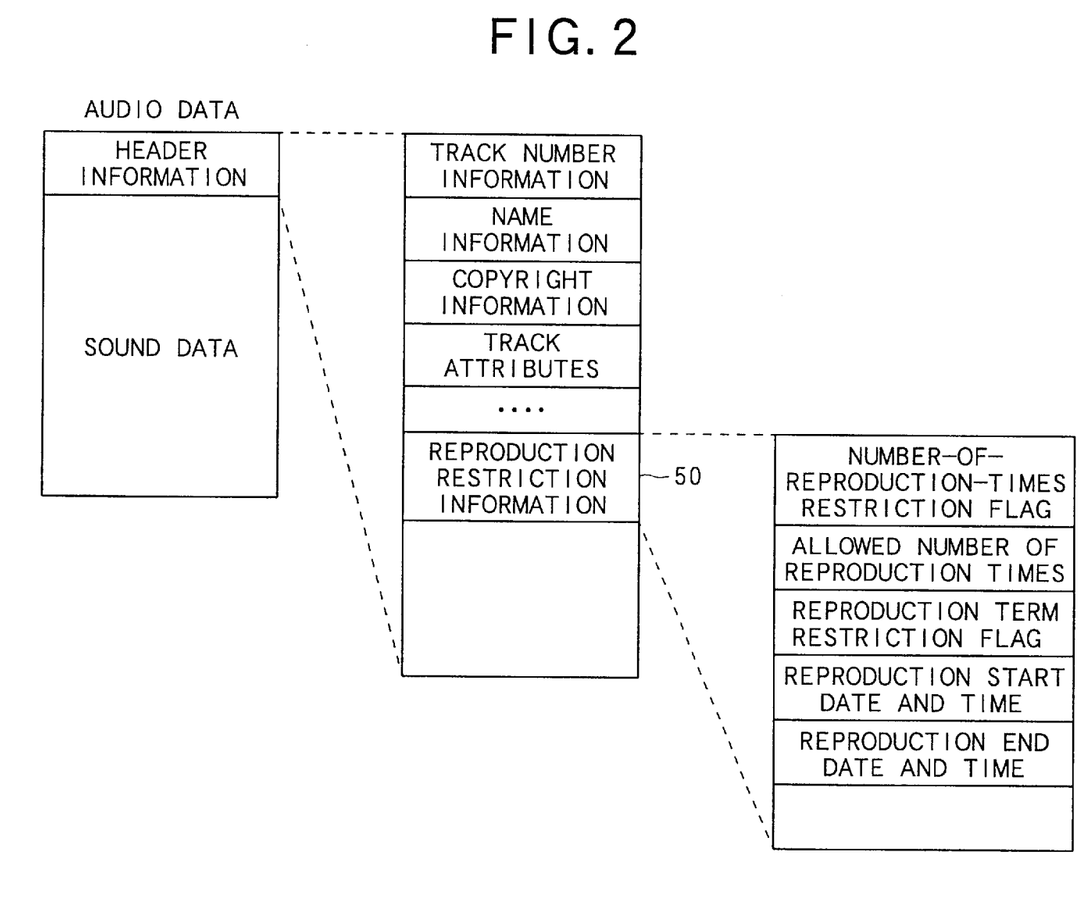
FIG. 2 shows an exemplary configuration of an audio data file for one music to which reproduction restriction information is added.

FIG. 2 shows an exemplary configuration of an audio data file (for one music) to which reproduction restriction information is added. As shown in FIG. 2, the audio data has a configuration in which header information is appended to sound (music) data, which is program information. The audio data is compressed by using ATRAC 3, for example, and encrypted for the purpose of copyright protection. The header information includes track number information, name information (the title of music, for example), and copyright information as well as reproduction restriction information 50. The reproduction restriction information 50 includes information such as a number-of-reproduction-times restriction flag, the number of times the data is allowed to be reproduced, a reproduction-term restriction flag, reproduction start date and time, and reproduction end date and time. The number-of-reproduction-times restriction flag indicates whether the number of reproductions of the sound data is restricted. If the number of times the data is allowed to be reproduced is restricted, the allowed number of reproduction times indicates the number of remaining allowed reproductions and is decremented each time the sound data is reproduced. The reproduction-term restriction flag indicates whether the reproduction term during which the sound data is allowed to be reproduced is limited. If it is limited, the sound data can be reproduced between the reproduction start date and time and reproduction end date and time.

The data read/record module 2 is responsible for reading audio data from the card-type recording medium 1 in accordance with instructions from the controller 7, which will be described later, and recording data on the card-type recording medium 1. When the card-type recording medium 1 is attached to the data read/record module 2, header information is read from the audio data by the data read/record module 2 and provided to the controller 7. When the data read/record module 2 receives a reproduction instruction from the controller 7, it reads the sound data in the audio data and provides it to the audio decoder 3.

The audio decoder 3 applies ATRAC 3 decoding, for example, to the sound data provided from the data read/record module 2 to convert it into a digital audio signal and provides it to the DAC 5 through the I/F 4. The DAC 5 converts the digital audio signal provided from the audio decoder 3 into an analog audio signal and provides it to an amplifier and loudspeakers. Then, sound is reproduced through the loudspeakers.

Provided on the operation/display module 6 are a continuous reproduction button as a continuous reproduction specifying device, a single-item reproduction button as a single-item reproduction device, a stop button, a fast-forward button, a pause button, a rewind button, or the like. The continuous reproduction button is for continuously reproducing sound data (music) in the order in which they are recorded on the card-type recording medium 1. The single-item reproduction button is for specifying a single-item of sound data (music) from among the sound data (music) stored on the card-type recording medium 1 to reproduce it. Also provided on the operation/display module 6 is a display device for displaying information such as a track number of sound data, a title, and information indicating that the music is prohibited to be reproduced. An operation signal is generated in the operation/display module 6 in response to the state of a button and outputted to the controller 7.

The controller 7 as a control device and a determination device, includes components such as a CPU having computing capability, compound logic circuits, a clock generator circuit, ROM, and SRAM and responsible for controlling all the components of the audio apparatus. The ROM stores control programs and required data. Header information provided by the data read/record module 2 under the control of the CPU is read into the SRAM. The CPU controls the reproduction of sound data in the audio data based on the operation signal provided from the operation/display module 6 and the header information in the SRAM.

Figure 3:
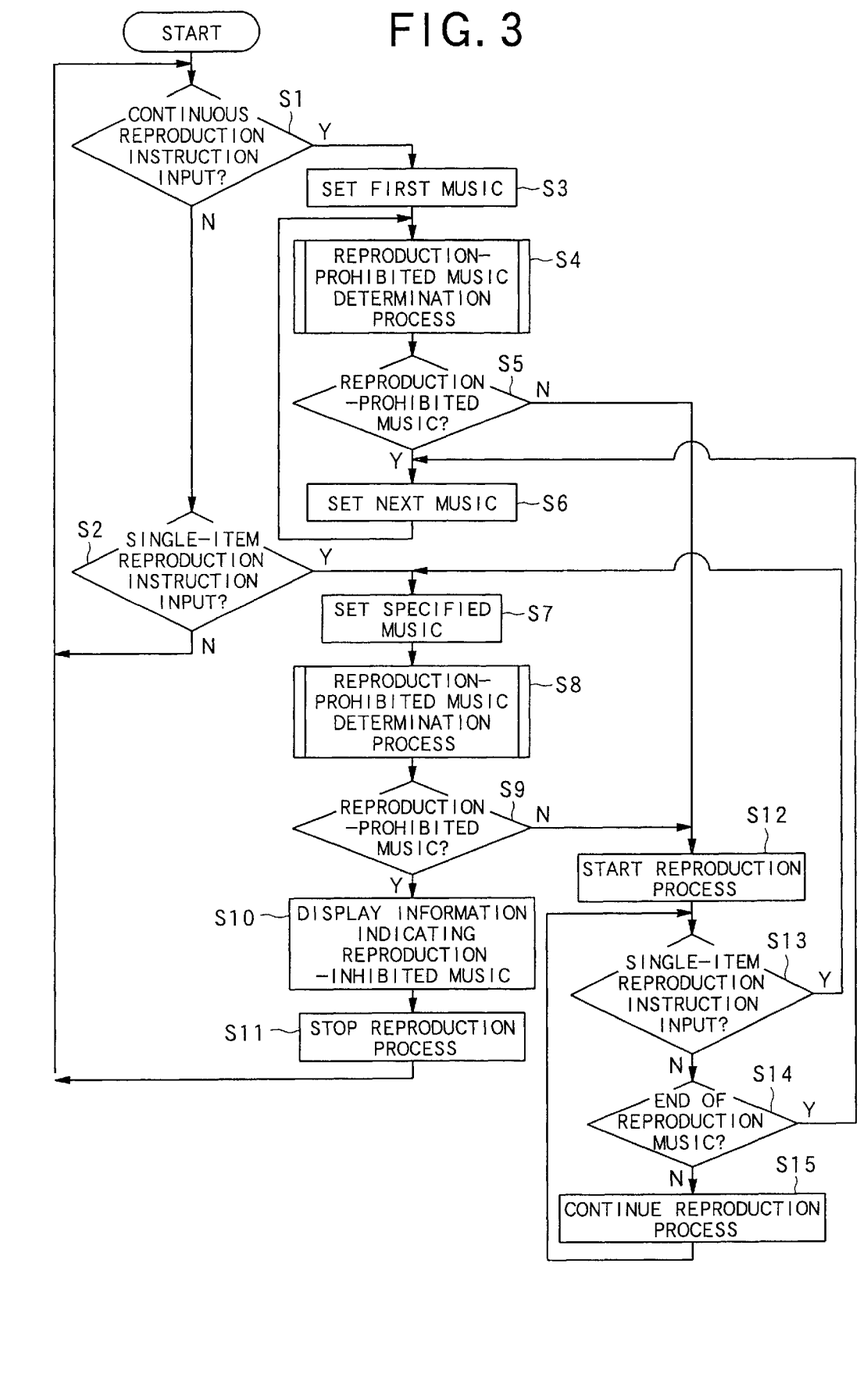
FIG. 3 shows a flowchart of a reproduction control process routine for audio data performed by a CPU.
Figure 4:
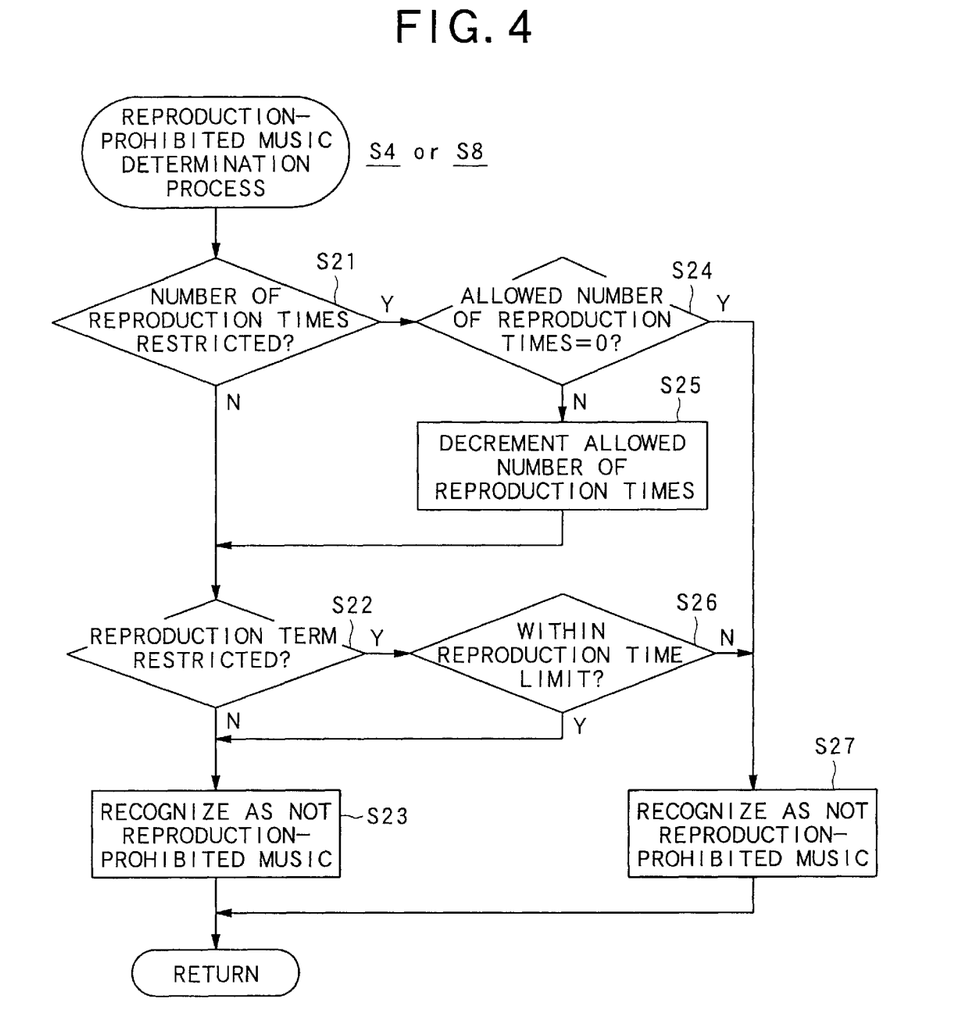
FIG. 4 shows a flowchart of a subroutine of a reproduction-prohibited music determination process shown in FIG. 3.

FIG. 3 shows a flowchart of a reproduction control process routine of the sound data performed in the CPU. FIG. 4 shows a flowchart of a subroutine of a reproduction-prohibited music determination process shown in FIG. 3. In the flowchart shown in FIG. 3, steps such as a step (process) performed in response to a reproduction stop instruction from the operation/display module 6 that do not directly relate to the present invention are omitted.

In the process shown in FIG. 3, the CPU monitors whether a continuous reproduction instruction is inputted (step S1) or whether a single-item reproduction instruction is inputted (step S2).

When the CPU detects a continuous reproduction instruction input at step S1, that is, a user depresses the continuous reproduction button on the operation/display module 6, the CPU sets the first music as a reproduction target music (step S3) then proceeds with a process for determining a reproduction-prohibited music (step S4).

In the reproduction-prohibited music determination process (in FIG. 4), the CPU references a number-of-reproduction-times flag in reproduction restriction information 50 stored in the SRAM to determine whether the number of reproduction times of the set first music is restricted (step S21). If the CPU determines that it is restricted (for example, the flag is set to "1"), the CPU proceeds to step S24. If the CPU determines that it is not restricted (for example, the flag is set to "0"), it proceeds to step S22.

At step S24, the CPU references the allowed number of reproduction times in the reproduction restriction information 50 to determine whether it is "0" (step S24). If the CPU determines that the allowed number of reproduction times is "0", the CPU recognizes that the music is prohibited to be reproduced (step S27). On the other hand, if the CPU determines that the allowed number of reproduction times is not "0", the CPU decrements the allowed number of reproduction times stored in the SRAM by 1 and rerecords a value for the allowed number of times in the header information on the card-type recording medium 1, then proceeds to step S22.

At step S22, the CPU references a reproduction-term restriction flag in the reproduction restriction information 50 to determine whether the reproduction term of the music is restricted. If the CPU determines that the reproduction term is not restricted (for example, the flag is set to "0"), the CPU recognizes the music as being not prohibited to be reproduced (step S23). On the other hand, if the CPU determines that the reproduction term is restricted (for example the flag is set to "1"), the CPU references the reproduction start date and time and reproduction end date and time in the reproduction restriction information 50 to determine whether the current date and time are within a reproduction time limit (step S26). If the CPU determines that they are not within the time limit, the CPU recognizes the music as a music prohibited to be reproduced (step S27). On the other hand, if the CPU determines that they are within the time limit, the CPU recognizes the music as a music not prohibited to be reproduced (step S23).

After the determination whether the first music set as the reproduction target music is reproduction-prohibited is made in this way, the CPU returns to the process shown in FIG. 3.

If the music is reproduction-prohibited (determination at step S5 is Yes), the process proceeds to step S6. If the music is not reproduction-prohibited (determination at step S5 is No), the process proceeds to step S12. At step S6, the CPU sets the next music as the reproduction target music, then performs the process at steps S4 and S5 on this music. In this way, the CPU provides instructions to the components for automatically skipping music prohibited to be reproduced and starting the reproduction process only for music allowed to be reproduced. (step S12). Thus, sound data corresponding to the set music is read from the data read/record module 2, converted into a digital audio signal using ATRAC 3, converted into an analog audio signal by the DAC 5, and then output through the loudspeakers.

During the reproduction of the set reproduction target music, the CPU monitors whether a single-item reproduction instruction is input (step S13) or whether the end of the music is reached (step S14). If the end of the music is reached, the CPU proceeds to step S6, sets the next music as the reproduction target music, and performs the process at steps S4 and S5 as described above. On the other hand, if the end of the music is not reached, the reproduction process of the reproduction target music is continued (step S15). If a single-item reproduction instruction input is detected at step S13, the CPU proceeds to step S7, which will be described later.

In this way, the CPU references in advance the reproduction restriction information about a music to be reproduced and, if the music is prohibited to be reproduced, automatically skips the music to continue the reproduction, thereby relieving the user of the burden of manipulating a button to skip the music.

Next, if the CPU detects a single-item reproduction instruction input at step S2, that is, if the user specifies a music by pressing the single-item reproduction button on the operation/display module 6, the CPU sets the specified music as the reproduction target music (step S7), then proceeds to the reproduction-prohibited music determination process (step S8). In this reproduction-prohibited music determination process, the process similar to the process at step 4 (shown in FIG. 4) described above are performed. If the CPU determines as a result of the determination in the reproduction-prohibited music determination process that the reproduction of the specified music is prohibited (determination at step S9 is Yes), the CPU displays an error message on the display of the operation/display module 6 to indicate that a music prohibited to be reproduced is selected (step S10), then stops the reproduction process (step S11). On the other hand, if the CPU determines as a result of the determination in the reproduction-prohibited music determination process that the specified music is not prohibited to be reproduced (determination at step S9 is Yes), the CPU starts the reproduction process for the specified music (step S12), then performs the process (steps S13 to S15) described above.

In this way, if the user specifies a music prohibited to be reproduced, the indication of that is displayed, therefore the user can readily know whether the music is prohibited to be reproduced.

As described above, according to the present embodiment, the apparatus is configured so as to automatically skip reproduction-prohibited music encountered after starting continuous reproduction of reproduction-prohibited music and reproduction-allowed music that co-reside on a card-type recording medium 1, thereby allowing the continuous reproduction of the music to be retained. Therefore, an easy-to-use audio apparatus can be provided that allows the user to be relived of the burden of operating the operation/display module 6 to skip a reproduction-prohibited music track each time such track is encountered. In addition, the apparatus allows the user to specify a desired music even during reproduction to check whether the music is prohibited to be reproduced and, if the music is allowed to be reproduced, the continuous reproduction can be continued after the check, thereby providing the user with a higher convenience.

If a music is prohibited to be reproduced, the music is skipped and the next music is set as the reproduction target at step S5 in the above-described embodiment. However, the present invention may be configured in such a way that at this point of time (between steps S5 and S6) the CPU causes the display of the operation/display module 6 to display information indicating that the music is skipped and the music of the skipped music or causes the loudspeakers to output a beep. In this configuration, the user can readily know the skipped, reproduction-prohibited music, therefore the convenience of the apparatus can be further improved.

While the embodiment described above is configured so that music to be reproduced are checked for reproduction restriction information one by one in the reproduction-prohibited music determination process, reproduction restriction information about a plurality of music may be checked at a time and, if it is determined that music prohibited to be reproduced are successively encountered, the reproduction-prohibited music may be skipped at a time in an alternative embodiment. This configuration can realize a more smooth reproduction of the music.

While the embodiment described above is configured in such a way that the allowed number of reproduction times is decremented at step S25 in the reproduction-prohibited music determination process, that is, the decrement is performed immediately before the reproduction of the music, the allowed number of reproduction times may be decremented after the music is reproduced, as described below. For example, when the reproduction process for the reproduction target music is started at step S12, the CPU starts measuring the amount of reproduction time. When the accumulated amount of time of reproduction of the music reaches a predetermined amount (stored in the header information of audio data, for example), the CPU determines that the reproduction of one music is completed and decrements (by one) the allowed number of reproduction times stored in the SPAM, then rerecords the allowed number of reproduction times in the header information in the card-type recording medium 1. On the other hand, if the user depresses any of the single-item reproduction button, stop button, fast forward button, and rewind button to stop the reproduction of the music before the accumulated amount of reproduction time reaches the predetermined amount, the value for the accumulated amount of time is reset without decrementing the value for the allowed number of reproduction times. The predetermined amount of time regarded as the reproduction time of one music is set to a value (for example 20 seconds) that does not infringe the copyright of the audio data. In this configuration, the user can determine whether he/she continues to listen to a music after he/she listens to the opening part (within a predetermined amount of time) of the music, therefore the convenience to the user can be further improved.

Furthermore, if it is determined that a music is prohibited to be reproduced in the reproduction-prohibited music determination process in the embodiment described above (step S27), the audio data may be deleted from the card-type recording medium 1 at predetermined timing.

While the embodiment has been described by way of example in which the information reproduction apparatus according to the present invention is applied to an audio apparatus, the present invention is not limited to this. Instead, the present invention can be applied to video apparatuses having recording capability or small, light-weight mobile devices.

While the embodiment has been described by way of example in which program information is audio data, the present invention is not limited to this. The present invention can also be applied to video data as well.

While the embodiment has been described with respect to audio data recorded on a card-type recording medium by way of example, the present invention is not limited to this. The present invention can be applied to program information distributed over a medium such as satellite data communications, digital broadcast, or the Internet, for example, and recorded on a recording medium such as hard disk, CD-R, or a DVD-R provided in an information reproduction apparatus.

As described above, according to the present invention, the apparatus is configured so as to automatically skip reproduction-prohibited program information encountered after starting continuous reproduction of reproduction-prohibited program information and reproduction-allowed program information that co-reside on a recording medium, thereby allowing the continuous reproduction of the program information to be retained. Therefore, an easy-to-use information reproduction apparatus can be provided that allows the user to be relived of the burden of operating the apparatus to skip a reproduction-prohibited music track each time such track is encountered. In addition, the user can readily check whether desired program information is prohibited to be reproduced by specifying the program information during reproduction and, if the check shows that the program information is not reproduction-prohibited, the user can continue the continuous reproduction. Therefore, high convenience can be provided to the user.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-166572 filed on Jun. 1, 2001 including the specification, claims, drawings and summary is incorporated herein by reference in its entirety.

What is claimed is:

1. An information reproduction apparatus for reproducing an item of program information from among a plurality of items of program information recorded on a recording medium, the plurality of items of program information including program information to which reproduction restriction information is added, comprising:

a continuous reproduction specifying device for specifying continuous reproduction of a plurality of items of program information recorded on the recording medium;

a determination device for determining based on the reproduction restriction information whether an item of program information is prohibited to be reproduced; and a control device for starting the continuous reproduction of the item of program information if the continuous reproduction of the item of program information is specified through the continuous reproduction specifying device, wherein the control device causes an item of program information determined by the determination device as being prohibited to be reproduced to be skipped and the reproduction to be continued after the continuous reproduction is started.

2. The information reproduction apparatus according to claim 1, further comprising a single-item reproduction device for specifying an item of program information among the plurality of items of program information recorded on the recording medium, wherein when reproduction of a certain item of program information is specified by the single-item reproduction device, if the certain item of program information is determined by the determination device as being prohibited to be reproduced, the control device causes the reproduction of the item of program information to be stopped.

3. The information reproduction apparatus according to claim 2, wherein if the continuous reproduction is specified through the continuous reproduction specifying device and reproduction of a certain item of program information is specified through the single-item reproduction device during the continuous reproduction of the items of program information, the control device causing the determination device to determine whether the specified certain item of program information is prohibited to be reproduced.

4. The information reproduction apparatus according to claim 3, wherein the control device causes the reproduction of the item of program information to be stopped if the specified certain item of program information is determined by the determination device as being prohibited to be reproduced.

5. The information reproduction apparatus according to claim 3, wherein the control device causes the specified certain item of program information to be reproduced and thereafter the continuous reproduction specified through the continuous reproduction specifying device to be continued if the specified certain item of program information is determined by the determination device as not being prohibited to be reproduced.

6. The information reproduction apparatus according to claim 1, further comprising a display device for displaying information, wherein the control device causes the display device to display information indicating that the item of program information determined by the determination device as being prohibited to be reproduced is prohibited to be reproduced.

7. The information reproduction apparatus according to claim 1, wherein the reproduction restriction information includes information for restricting the number of times which the items of program information is allowed to be reproduced or information for restricting the term during which the items of program information is allowed to be reproduced.

8. An information reproduction method of reproducing an item of program information from among a plurality of items of program information recorded on a recording medium, the plurality of items of program information including program information to which reproduction restriction information is added, comprising:

a process of determining whether continuous reproduction of a plurality of program information recorded on the recording medium is specified;

a process of determining whether reproduction of one item of program information among the plurality of items of program information recorded on the recording medium is specified;

a process of determining based on the reproduction restriction information whether the item of program information is prohibited to be reproduced;

a process of causing the continuous reproduction to be started and causing the item of program information determined as being prohibited to be reproduced to be skipped and the continuous reproduction to be continued if the continuous reproduction is specified; and a process of causing reproduction of the item of program information to be stopped if reproduction of the one item of program information is specified and the item of program information is determined as being prohibited to be reproduced.

* * * * *

UNITED STATES PATENT AND TRADEMARK OFFICE
CERTIFICATE OF CORRECTION

PATENT NO.   : 6,747,920 B2
DATED        : June 8, 2004
INVENTOR(S)  : Denda et al.

It is certified that error appears in the above-identified patent and that said Letters Patent is hereby corrected as shown below:

Title page,
Item [54], Title, should read -- INFORMATION REPRODUCTION APPARATUS AND INFORMATION REPRODUCTION METHOD --

Signed and Sealed this

Twelfth Day of October, 2004

JON W. DUDAS
*Director of the United States Patent and Trademark Office*